(12) United States Patent
Meyer et al.

(10) Patent No.: US 9,888,577 B2
(45) Date of Patent: Feb. 6, 2018

(54) PASSIVE ELECTRICAL DEVICES WITH A POLYMER CARRIER

(71) Applicant: INTEL CORPORATION, Santa Clara, CA (US)

(72) Inventors: Thorsten Meyer, Regensburg (DE); Gerald Ofner, Regensburg (DE); Sven Albers, Regensburg (DE); Reinhard Mahnkopf, Oberhaching (DE)

(73) Assignee: Intel Corporation, Santa Clara, CA (US)

( * ) Notice: Subject to any disclaimer, the term of this patent is extended or adjusted under 35 U.S.C. 154(b) by 291 days.

(21) Appl. No.: 14/229,476

(22) Filed: Mar. 28, 2014

(65) Prior Publication Data
US 2015/0282308 A1     Oct. 1, 2015

(51) Int. Cl.
*H05K 1/18* (2006.01)
*H01L 23/498* (2006.01)
(Continued)

(52) U.S. Cl.
CPC ....... *H05K 1/181* (2013.01); *H01L 23/49822* (2013.01); *H01L 23/5227* (2013.01); *H01L 23/66* (2013.01); *H05K 1/0292* (2013.01); *H05K 1/165* (2013.01); *H01L 21/568* (2013.01); *H01L 23/49827* (2013.01); *H01L 24/00* (2013.01); *H01L 24/96* (2013.01); *H01L 25/0655* (2013.01); *H01L 25/0657* (2013.01); *H01L 25/16* (2013.01); *H01L 25/18* (2013.01); *H01L 2224/04042* (2013.01); *H01L 2224/12105* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/06517* (2013.01); *H01L 2225/06568* (2013.01); *H01L 2924/1431* (2013.01); *H01L 2924/1434* (2013.01); *H01L 2924/15311* (2013.01); *H01L 2924/19011* (2013.01); *H01L 2924/19105* (2013.01); *H05K 1/0233* (2013.01); *H05K 1/162* (2013.01); *H05K 1/185* (2013.01); *H05K 3/4644* (2013.01); *H05K 2201/10636* (2013.01); *H05K 2203/1469* (2013.01); *H05K 2203/171* (2013.01);
(Continued)

(58) Field of Classification Search
CPC ............... H05K 1/0313; H05K 1/0231; H05K 2201/09372; H05K 1/111; H05K 1/117; H05K 3/341
USPC ......................................................... 361/729
See application file for complete search history.

(56) References Cited

U.S. PATENT DOCUMENTS 7,919,868 B2    4/2011  Hedler
8,624,353 B2 *  1/2014  Lin ................. H01L 21/561
                                                257/531
(Continued)

*Primary Examiner* — Courtney Smith
*Assistant Examiner* — Jessey R Ervin
(74) *Attorney, Agent, or Firm* — Schwabe, Williamson & Wyatt, P.C.

(57) ABSTRACT

Passive electrical devices are described with a polymer carrier. In one example, a conductive layer is formed over a polymer substrate in a pattern to form a passive electrical device and at least two terminals of the device. A plurality of external connection pads are connected to the terminals of the device.

20 Claims, 13 Drawing Sheets

(51) Int. Cl.
  *H01L 23/522*  (2006.01)
  *H01L 23/66*  (2006.01)
  H05K 1/02  (2006.01)
  H01L 23/00  (2006.01)
  H05K 1/16  (2006.01)
  H05K 3/46  (2006.01)
  H01L 21/56  (2006.01)
  H01L 25/065  (2006.01)
  H01L 25/16  (2006.01)
  H01L 25/18  (2006.01)

(52) U.S. Cl.
  CPC . *H05K 2203/173* (2013.01); *H05K 2203/175* (2013.01); *Y02P 70/611* (2015.11)

(56) References Cited

U.S. PATENT DOCUMENTS

| | | | |
|---|---|---|---|
| 2010/0096725 A1* | 4/2010 | Shi | H01L 23/49822 257/531 |
| 2011/0010749 A1* | 1/2011 | Alkan | H03H 1/00 725/127 |
| 2011/0204513 A1* | 8/2011 | Meyer | H01L 24/96 257/738 |
| 2015/0028478 A1* | 1/2015 | Meyer | H01L 25/0655 257/738 |
| 2015/0217991 A1* | 8/2015 | Minervini | H05K 1/0268 257/48 |

* cited by examiner

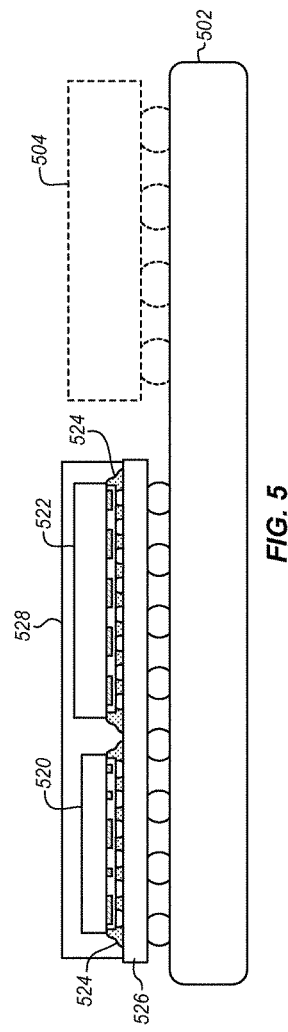
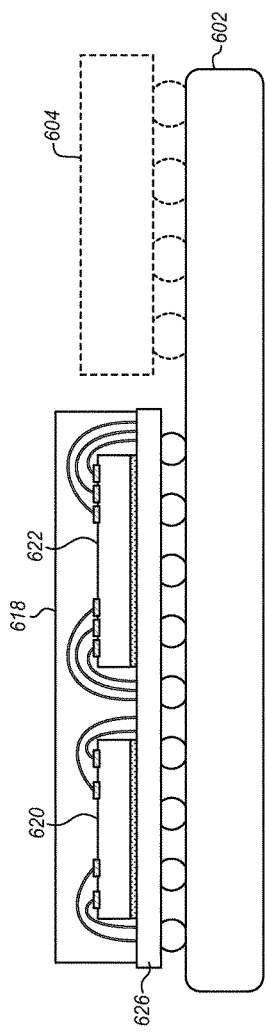

PASSIVE ELECTRICAL DEVICES WITH A POLYMER CARRIER

FIELD

The present invention relates to the field of semiconductor devices and, in particular, to integrated passive devices with semiconductor packages.

BACKGROUND

As compared to active devices, such as transistors for logic and memory, passive devices are used in electronic devices to transform, smooth, and balance electrical and radio signals. They are used in power supplies, transmitters, sensors, reference signal sources, timing circuits, and a wide range of other systems and circuits. A silicon die is typically made of materials and using processes that are optimized for active devices. With millions of active transistors on a device, a designer may simulate a capacitor or resistor using modified transistors or diodes rather than form a poor performance version of such a device in the silicon die.

With increasing mobility, electronic devices are designed to incorporate radio components and batteries and also be more compact for portability. This means that the extra space required for quality passive devices becomes a more significant obstacle to miniaturization. Integrated Passive Devices (IPD) are seen as a technology for reducing the impact of passive devices on overall product size. IPDs are attracting an increasing interest in mobile devices like phones and tablets. IPDs help to further decrease the size and cost of a product and increase the functionality and performance of those devices.

Classical IPD components are produced on silicon material. Thin film technology, e.g. sputtering, electroplating, and spin-coating, is typically used to generate the passive structures. IPDs can be made as coils, capacitors (high-density trench capacitors, MIM capacitors), high-Q inductors, resistors, baluns, filters, PIN diodes or Zener diodes and still more types of devices which can all be built in a single silicon component.

Embodiments of the invention are illustrated by way of example, and not by way of limitation, in the figures of the accompanying drawings in which like reference numerals refer to similar elements.

FIG. 5 is a cross-sectional diagram of another alternative system board with an integrated passive device package according to an embodiment.

FIG. 6 is a cross-sectional diagram of another alternative system board with an integrated passive device package according to an embodiment.

DETAILED DESCRIPTION

Figure 1A:
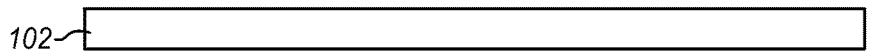
FIGS. 1A-1H are cross-sectional diagram of stages of fabrication of integrated passive devices on a polymer based carrier according to an embodiment.

Integrated passives structures may be built using classical thin-film or even PCB technology on a polymer carrier even when no silicon is included. This provides strongly improved Q-factors for the integrated passives. Additionally the coils, resistors, etc. may be made tunable using semiconductor process technologies, like laser drilling, laser cutting, printing, dispensing, etc.

A tunable IPD with strongly improved Q factors may be made on a polymer foundation or on a package with a polymer basis part. The tunability may be built in to devices formed on a polymer carrier material. The tunability may be built in to devices in which the elements, such as inductors etc., are integrated into a conventional package type, for example in the fan-out-area of a molded fan-out WLB (Wafer Level Ball Grid Array), other fan-out package types (e.g. panel level fan-out), a flip chip package or an embedded die package.

IPDs based in a silicon carrier material have a limited Q-factor because of the material and design limitations of silicon and silicon processing technology. The close proximity of the IPD to the silicon substrate and to the back-end-of-line (BEOL) metallization reduces the performance of the IPD, such as an inductor. While metal shielding has been used to mitigate this limitation, such metal layers make use of on-chip metal layers, which reduces on-chip routing capability. In addition, any metal layer below or above the coils will reduce the quality of the coils due to eddy-currents.

By creating IPDs on a separate polymer substrate, the shape and the placement of the different metal layers can be optimized for the IPDs without interfering with the needs of the silicon devices on the chip. The polymer substrate also allows lasers to be used to tune the IPDs. In an active silicon die, such a laser would damage the silicon carrier or structures in the back-end-of-line (BEOL) metallization. A variety of different polymers may be used as a foundation for IPDs including a molded substrate as the carrier.

Using the polymer as a substrate also provides an improvement in the Q-factor for coils and other types of devices that are formed over polymer areas. In one example the Q-value at 2 GHz is 88.6 for a coil over mold compound. Over silicon the same coil has a Q-factor of 3.5.

The polymer substrate may be formed of a variety of different materials, including a molded substrate or a laminate based carrier. The molded compound may be a polymer material including an epoxy-based mold compound with or without fillers or a reconstituted wafer material or another type of polymer material. This substrate serves as the carrier material for the IPD. The process steps can be the same as those used on a silicon carrier or specially adapted operations may be used. Spin-coating, sputtering, photo-lithography, electroplating and other thin-film process technologies can also be used on a molded wafer. PCB-origin technologies, such as lamination, electro-less plating and laser structuring may also be used on polymer wafers or polymer substrates.

The polymer material may be a mold material, filled with one or more filler materials like $AlO_2$, silica and similar materials. The polymer material may also be a laminate, prepreg or similar material. The prepreg may be a fiberglass pre-impregnated epoxy resin. Any of a variety of different materials with a low dissipation factor and low dielectric constant may be used to provide high Q-factor performance.

A polymer-based IPD can be constructed in a variety of different ways. One option is to use a process flow similar to that for a fan-out WLB. A carrier of any format (round, rectangular, any shape) may be equipped with an adhesive layer. This may be a double sided adhesive foil, an adhesive layer or similar. The adhesive layer may be spin-coated, laminated or printed, for example. The adhesive layer may be releasable by adding energy (e.g. temperature, chemical energy, etc.). A mold compound may then be pressed into the format of a wafer, a substrate or any other format by means of compression or injection molding, lamination or pressing.

The molded substrate may be released from the carrier by adding energy. The polymer substrate becomes the starting point for generating the passive structures. A dielectric layer may be applied and may be structured. Also, the front side of the molded wafer (and/or the backside) may be grinded. Metallization layers are applied, typically by sputtering and electroplating or electro-less plating and electroplating. The metallization process is capable of depositing 8 microns or more of copper or other conductive material on the polymer substrate. The copper layer or layers may be thicker or thinner and different conductive layer may have different thicknesses. This results in high Q components that reduce loss in the RF signal transmission path, thereby increasing battery performance of the wireless system and improving reception. Also, PCB-based technology can be used for the application of the layers. This may include the lamination of dielectric layers, electro-less plating and laser drilling.

It is also possible to embed passive SMD components into the mold compound/laminate, in order to achieve special or high values for resistance, inductance, or capacitance. Magnetic materials (used for example in magnetic core, and similar structures) low-k-materials may be embedded into the mold compound or laminate, e.g. by a pick and place processes prior to the molding/lamination. This way, areas in the IPD component with special properties may be generated.

Figure 1B:
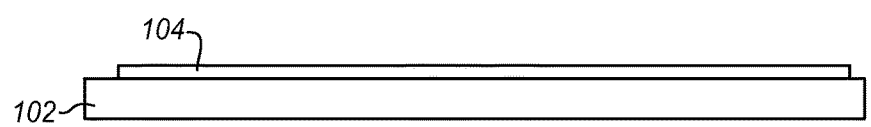
Figure 1C:
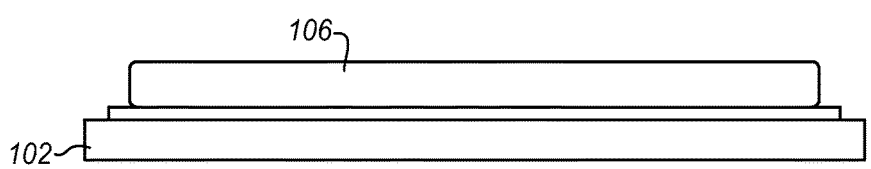

These techniques are demonstrated in the drawings. FIGS. 1A to 1H are cross-sectional diagrams of stages of fabrication of integrated passive devices on a polymer based carrier. FIG. 1A shows a temporary carrier 102 made of any desired material, for example, polymer, metal, glass or some other compound. In FIG. 1B an adhesive is applied over the temporary carrier. The adhesive may be applied by lamination, printing or in any other way. In FIG. 1C the polymer carrier 106 for the IPDs is formed over the adhesive. The polymer carrier may be formed by compression molding, lamination, pressing, printing or any other variety of different ways.

Figure 1D:
Figure 1E:

In FIG. 1D the temporary carrier 102 and the adhesive 104 are released from the polymer carrier 106 by releasing the adhesive. This leaves the polymer carrier exposed on both the top and bottom sides. In FIG. 1E a dielectric layer 108 may be applied to the bottom side of the polymer carrier 106. The dielectric may be optional depending on the particular characteristics of the polymer carrier. If the polymer carrier is sufficiently dielectric then no additional dielectric layer may be necessary.

Figure 1F:
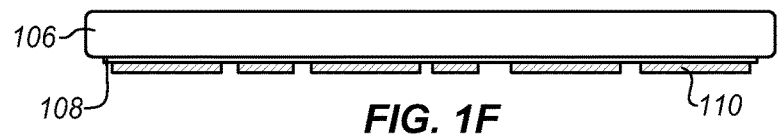

In FIG. 1F conductive patterns 110 are formed over the dielectric 108 in shapes that form any desired passive electric device. The patterns may be formed in the same way that redistribution layers (RDL) are applied over a polymer. The patterns may be formed by first depositing the conductive seed material, such as titanium, titanium-tungsten, chrome or similar materials as an adhesion promoter and barrier layer and copper or a similar material as seed layer. Photoresist may then be applied and exposed in a desired pattern and developed.

Copper, nickel, gold palladium or any other suitable material or combinations or stack are electroplated onto the seed layer in the openings of the photoresist. The photoresist is removed and the seed layer and the barrier layer are etched away, leaving the electroplated redistribution lines. Alternatively, the pattern may be generated subtractively. The conductive seed layer and barrier layer material may be etched away in the exposed areas and the photoresist removed to reveal the conductive pattern underneath. A protective dielectric layer may then be formed over the conductive layer and patterned to provide openings to terminals to electrically connect to terminals formed in the patterned electrical layer. The conductive layer or the dielectric layer may alternatively be patterned in other ways including printing, laser milling, etc.

In this example the patterns are formed on the underside of the carrier 106, however, the patterns may be formed on the top or on both sides simultaneously or one after the other. The redistribution structures 110 are formed in configurations and shapes that form passive elements such as coils, lines, parallel lines, and other structures as described in more detail below.

Figure 1G:
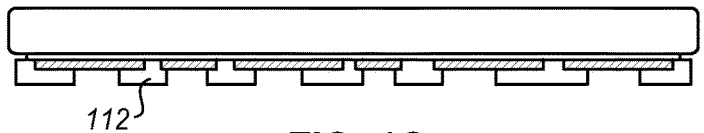

In FIG. 1G a solder stop layer 112 is applied over the redistribution structures 110. The solder stop 112 allows solder balls 114 to be applied over the redistribution structures as show in FIG. 1H.

In the event that more complex redistribution structures are desired then after the first layers of structures are formed in FIG. 1F an additional dielectric layer may be formed over those structures and then additional redistribution structures may be formed followed by another dielectric layer and another redistribution layer. In this way, multiple layers of passive devices may be formed. The passive devices 110 formed by the redistribution layer structures may be formed of any of a variety of different metals depending upon the particular implementation.

Figure 2A:
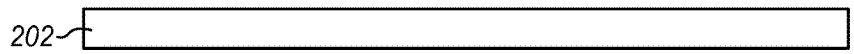
FIGS. 2A-2I are cross-sectional diagram of alternative stages of fabrication of integrated passive devices on a polymer based carrier according to an embodiment.
Figure 2B:
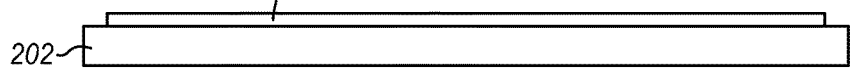

FIGS. 2A to 2I show a similar process as stages of operations in which additional passive features are incorporated into the integrated passive devices using passive or active surface mount devices. Additional circuits can be formed combining integrated passive devices with surface mount devices. In FIG. 2A the temporary carrier 202 is prepared as in FIG. 1A. In FIG. 2B an adhesive 204 is laminated or printed over the temporary carrier 202.

Figure 2C:
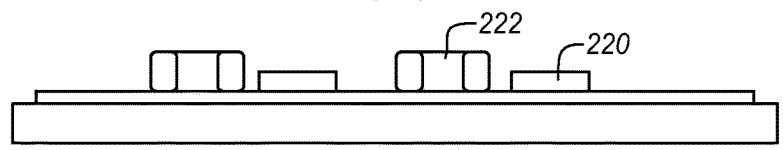
Figure 2D:
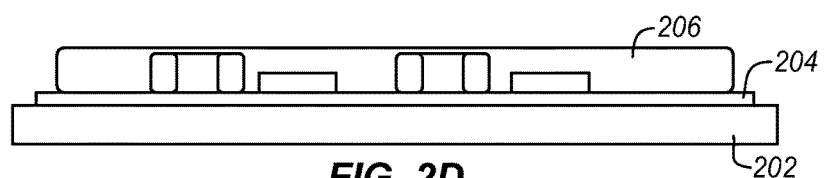

In FIG. 2C one or more surface mount or other passive devices such as capacitors 220 and coils or inductors 222 are placed on the adhesive layer at the top of the temporary carrier. A pick and place machine, chip shooter or any other type of manufacturing tool may be used to precisely place these SMD (Surface Mount Device) components in the correct location. In FIG. 2D the polymer carrier 206 is molded, laminated or pressed on the adhesive layer 204 of the carrier 202. This polymer carrier partially or completely covers the SMD components 220, 222. In addition to providing a surface upon which to form the IPDs using redistribution layer technology, the polymer carrier also fixes the positions of the SMDs that are embedded in the polymer carrier.

Figure 2E:
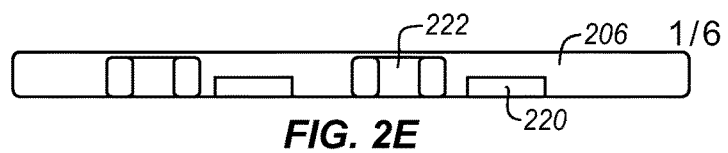
Figure 2F:
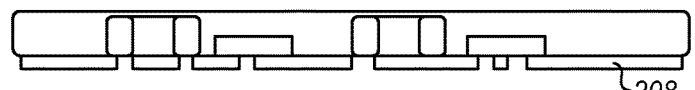

In FIG. 2E the temporary carrier and adhesive are removed from the polymer carrier and the connection side of the SMDs 220, 222 is exposed. In FIG. 2F a dielectric is applied and structured 208 over the bottom side and over the exposed contact points of the SMDs. This dielectric may be formed as in FIG. 1E using conventional photolithography techniques or another type of patterning technology (e. g. laser).

Figure 2G:
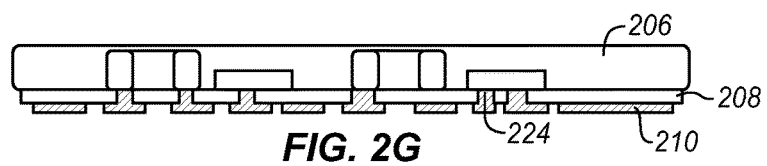

In FIG. 2G RDL (Redistribution Layer) technology, such as the technology described above is used to form passive RDL structures 210 over the dielectric layer 208. These structures as shown include vias 224 into the connection points of the SMD components. These connections allow the passive structures to form circuits with the SMD components and may also allow the SMD components to connect to solder balls. These structures may also allow external connections to the SMD components. The passive structures formed from the RDL technology can form a variety of different components as mentioned above including filters, couplers, duplexers, and a variety of different capacitors and inductors.

Figure 1H:
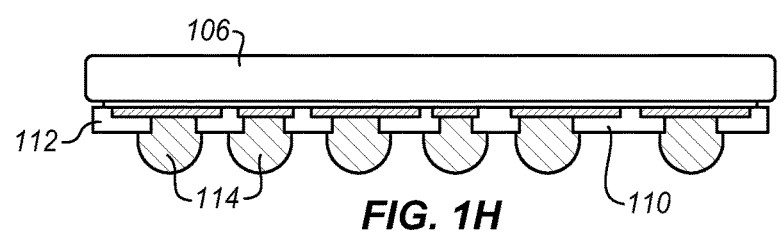
Figure 2H:
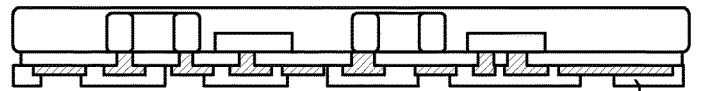
Figure 2I:
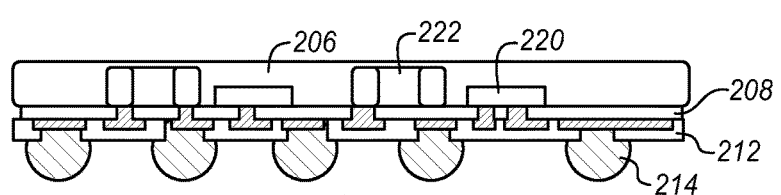

In FIG. 2H a solder stop layer is applied over the passive IPD devices 212 and in FIG. 2I a ball grid array 214 is formed over the solder stop. As in the example of FIG. 1F, additional RDL layers and dielectric layers may be formed to build more complex multi-layer IPD structures depending on the intended application. In addition, in FIGS. 2I and 1H the solder ball connections may be replaced with different types of external connectors depending upon how the IPD is to be used. Flip chip bumps, flip chip copper pillars, wire bond pads, and arrays of other types of grids or pads may be used instead of a solder ball connection.

While RDLs are applied to form IPDs on only one side of the polymer substrate in FIGS. 1F and 2G, the invention is not so limited. Vias may be formed through the mold body for example by using pre-fabricated via bars or by drilling and conductively filling the drilled channels. Both the front side and the backside of the polymer substrate, a mold body as described herein, can then be used for the application of passive structures. The vias are used to connect the IPDs to other components on opposite sides or to each other. Using both sides reduces the required dimensions for a particular set of devices. Current PCB technology allows for the front and back sides of a substrate to be processed simultaneously.

Figure 3:
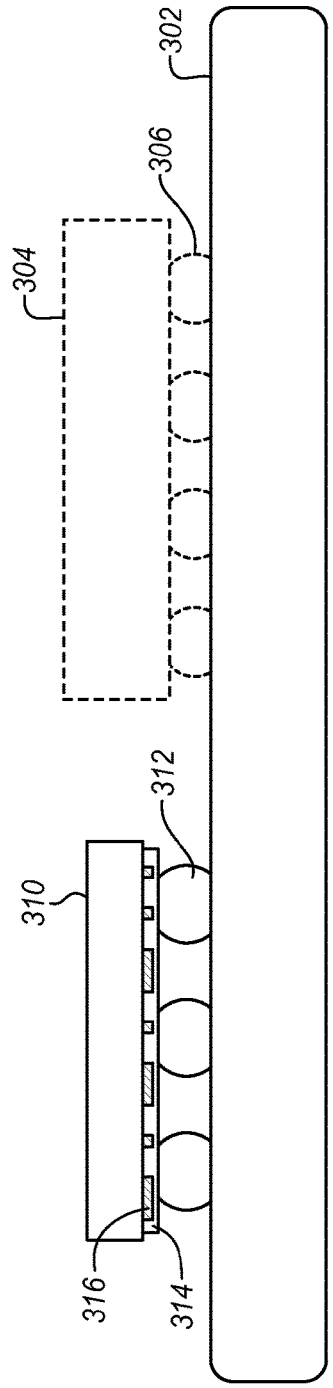
FIG. 3 is a cross-sectional diagram of a system board with an integrated passive device package according to an embodiment.

FIG. 3 is a cross-sectional diagram of a printed circuit board (PCB) 302 of a compact device which may be a portable communication device such as a cellular telephone, a tablet or any other compact device. PCB 302 has a variety of other components 304 attached in this example using a ball grid array 306. While only one other component 304 is shown, there may be many more depending upon the particular system design.

In addition, a mold embedded IPD package 310 is also attached using a solder ball grid 312 as shown. As illustrated the mold embedded IPD package has a simple structure with a mold substrate, a metal layer patterned to form IPDs and a solder stop layer 314 to provide a isolation between IPDs, physical protection of the exposed metal, and solder ball attachment points to connect the solder balls to the redistribution layers 316. There may additionally be multiple RDL layers to form additional passive devices as well as additional components embedded in the mold substrate of the package 310 depending upon the intended implementation.

Figure 4:
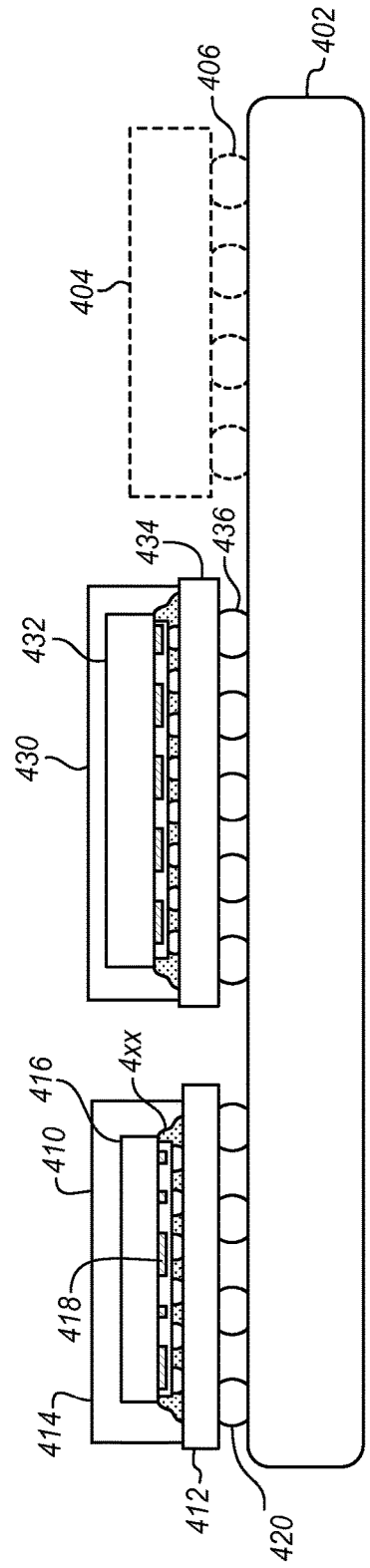
FIG. 4 is a cross-sectional diagram of an alternative system board with an integrated passive device package according to an embodiment.

FIG. 4 shows an alternative system board 402 using different package technology for a different application. As shown there are many other components 404, attached to the PCB 402 in this case using a ball grid array. However, this or others of the components may also be flip chip components, wire bonded packages, QVN (quad-flat no leads) packages, or any other type of package depending upon the component and the particular system design.

The mold based IPDs in this case are packaged as a flip chip package. The flip chip package has a package substrate 412 and a molded or solid cover 414, although any other type of cover may be used instead. The mold and IPD structure, as shown in FIG. 1H, has a mold carrier 416, and RDL layers 418 to form the IPDs. The RDL layers are coupled through solder surface mount connections, for example, a C4 (Controlled Collapse Chip Connection) attached to the substrate 412. The substrate has a ball grid array 420 to connect to the PCB. This type of packaging allows the IPD package to be attached to the PCB in the same way as a logic die.

FIG. 4 also shows an integrated circuit package 430 which contains a silicon semi-conductor logic component 432 attached to a substrate 434 as a flip chip package and attached also with a ball grid array 436 to the PCB 402.

FIG. 5 shows a further alternative in which a mold IPD 520 is attached beside a logic die 522 to a common substrate 526 in a shared or common flip chip package 528. Alternatively, instead of a logic die, the second die 522 may be an application processor, another IPD, a memory component or a device with any other desired functionality. The dies are attached to the substrate using solder bumps, C4, or any other high pitch connection technology. The two dies together in a single package take far less room on the PCB than the two dies would if packaged separately. Again, the system has a PCB 502 which is a system board, or daughterboard for another system or sub-system. The board 502 includes packages for other components 504 which are attached to the PCB 502 in a manner similar to the combined package.

FIG. 6 shows a further alternative in which a combined package 618 contains both the passives die 620 and the active components die 622 on a common package substrate 626. In this case the two dies are in a wire bond NGA package configuration, the PCB 602 carries and connects to the shared combined package 618. Other components 604 are also carried on the PCB 602 depending upon the particular device that is to be implemented. In addition to the individual package and side-by-side package configuration the mold IPD die may also be stacked with an active or logic die to form a more compact but taller package.

Figure 7:
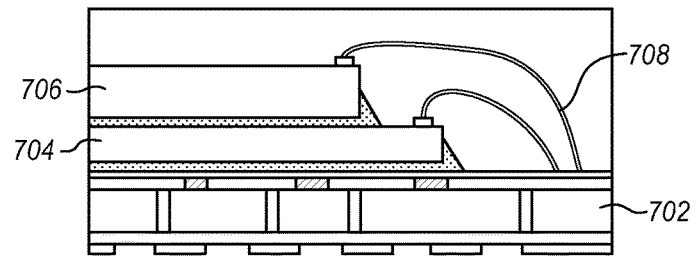
FIG. 7 is a cross-sectional diagram of a wire bond-wire bond package with integrated passive devices according to an embodiment.

FIG. 7 is a cross-sectional side view of a wire bond wire bond stacked die package. The package substrate 702 carries a logic die or other type of die 704 and an IPD die 706 the dies are stacked and may be connected together using pads, lands or connection grids on the two dies. In addition, wire bond leads 708 connect the dies to the package substrate 702. The package substrate has a connection array 704 to allow the package to be attached to a system board such as those of FIGS. 5 and 6.

Figure 8:
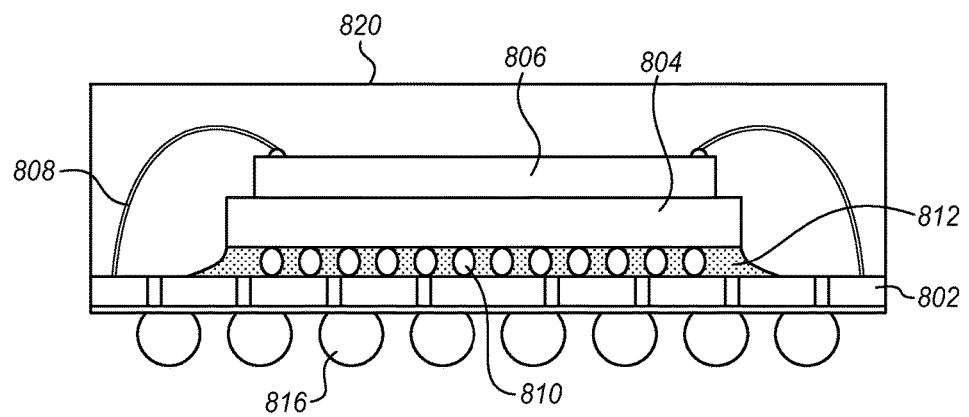
FIG. 8 is a cross-sectional diagram of flip chip package with integrated passive devices according to an embodiment.

A further alternative package is shown in the cross-sectional diagram of FIG. 8. In this case, a flip chip wire bond stacked configuration has a package substrate 802 to carry the IPD die 804 and the active (or passive) component die 806. These dies are stacked together and may have connections directly between each other. Wire bonds 808 further connect the stacked dies to external components. The stacked dies are attached with a land grid array 810 to the package substrate. The land grid array is protected with an underfill 812 between the dies and the package substrate. Solder balls 816 are attached to the bottom of the package substrate 802 to allow the stacked die to be coupled to a PCB, for example. A cover 820 is applied over both of the dies and the package to protect the dies and the wire bonds. The cover may be made of mold compound or any other suitable substance.

In the examples of FIG. 7 and FIG. 8 in which the two dies are stacked, the active logic die may be on the bottom or on the top and the IPD die in the other position, depending upon the particular implementation and use for the die. In addition, instead of an active logic die, a variety of different types of other dies may be used including power, optical, RF, and other types of analog dies.

In general, different structures can be applied to the polymer IPD substrate. The following FIG. 5 shows one embodiment. The dielectric layer is optional. The drawing is not to scale.

As mentioned above, the RDL technology may be used to form a variety of different types of devices. Instead of RDL technology, any suitable technique may be used for forming conductive patterns on a polymer substrate. These may include conventional photolithography techniques, deposition techniques, printing and other methods.

Figure 9A:
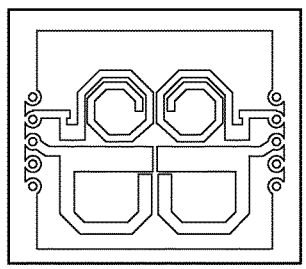
FIGS. 9A to 9G are top plan views of passive devices formed on a substrate using conductive patterns according to an embodiment.
Figure 9B:
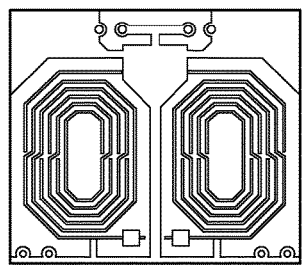
Figure 9C:
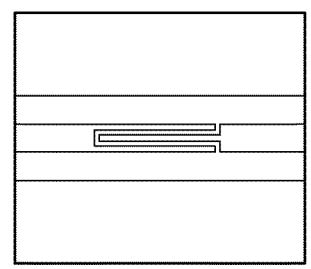
Figure 9D:
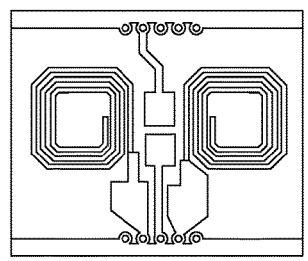
Figure 9E:
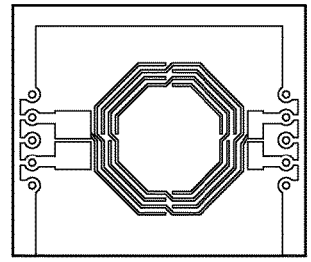
Figure 9F:
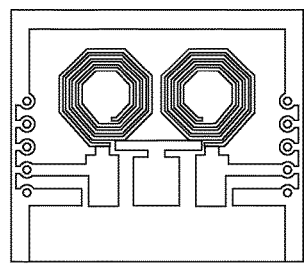
Figure 9G:
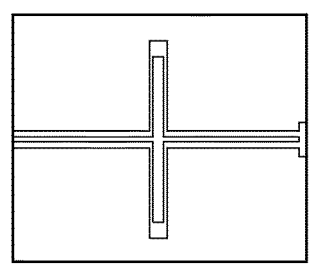

FIGS. 9A to 9G are top plan views of a variety of different devices that may be formed using simple one dimensional conductive patterns on a dielectric polymer surface. FIG. 9A shows a band pass filter, suitable for a wireless local area network. FIG. 9B shows an ISM (Industrial Scientific and Medical) band coupler. FIG. 9C shows a high frequency capacitor. FIG. 9D shows an L band balun useful for GSM (Global System for Mobile Communications) communications chips. FIG. 9E shows a duplexer. FIG. 9F shows a low pass filter and FIG. 9G shows a stub for impedance matching. All of these components as well as simpler coils and capacitors may be formed using a single layer of conductive material applied over a polymer.

Figure 10A:
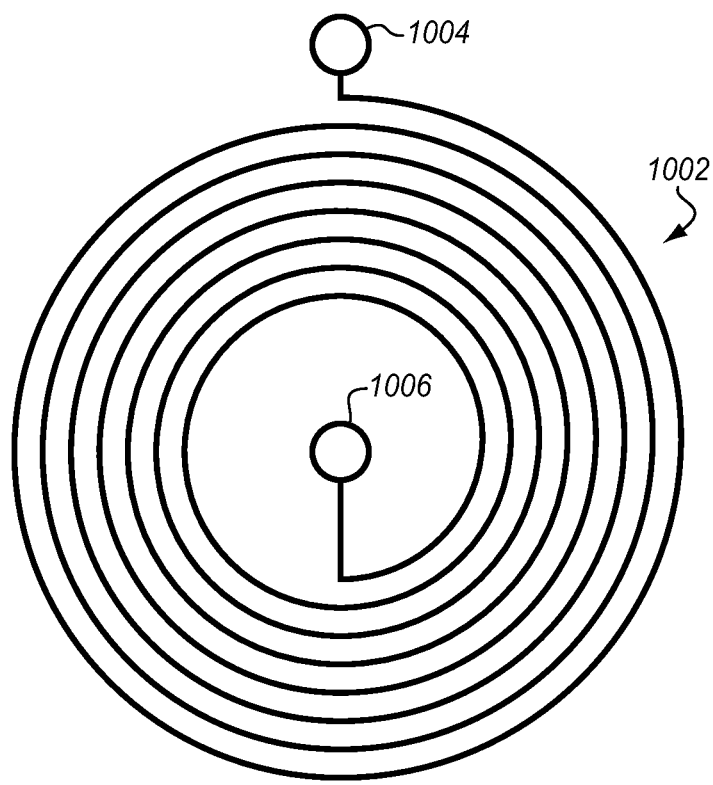
FIGS. 10A and 10B are top and side cross-sectional diagrams, respectively, of a coil formed on a polymer substrate according to an embodiment.

FIG. 10A shows an example of a simpler device which may be formed using RDL technology on a polymer carrier as described above. In FIG. 10A a coil 1002 is formed as a winding circular pattern with a first terminal 1004 and a second terminal 1006. FIG. 10A is a bottom plan view of the RDL 108 forming a coil taken as seen on the IPD mold structure shown, for example, in FIG. 1F.

Figure 10B:
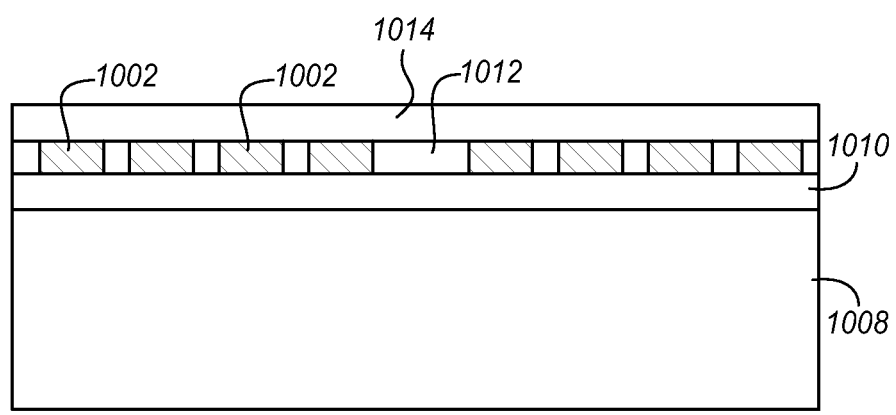

FIG. 10B shows the same coil 1002 as a cross-section through the completed mold IPD. This view is reversed from that of FIG. 1H so that the RDL passives are formed on the top instead of the bottom. The polymer mold layer 1008 is covered with a dielectric layer 1010 and the coil 1002 is formed over the dielectric layer. A further dielectric 1012 is formed to isolate the loops of the coil from each other. Finally a passivation layer 1014 and other connection layers are formed over the coil. This coil may be used as an inductor or as part of any other type of component including those components shown in FIGS. 9A to 9G.

Figure 11A:
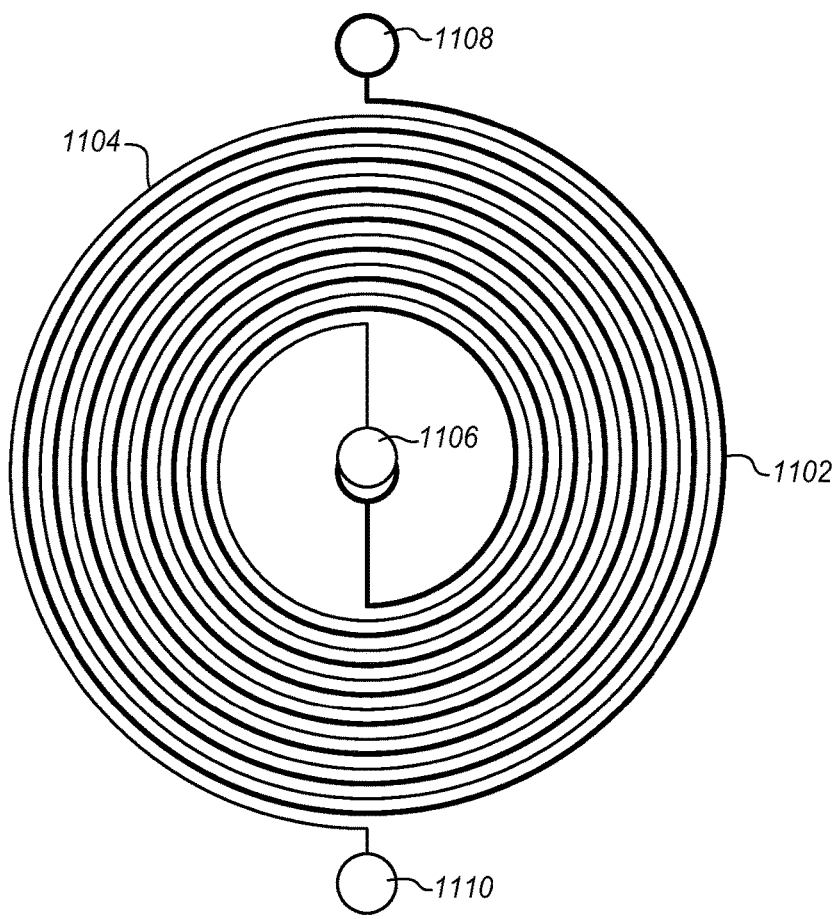
FIGS. 11A and 11B are top and side cross-sectional diagrams, respectively, of two concentric coils formed on a polymer substrate according to an embodiment.

FIG. 11A shows how two coils can be formed in a single layer. FIG. 11A is a top plan view of the coil as formed in the IPD mold. There is a first coil 1102 and second coil 1104 which may share a common center terminal 1106. The first coil has a first terminal 1108. The second coil has a second separate terminal 1110. The coil windings are concentric but do not touch.

Figure 11B:
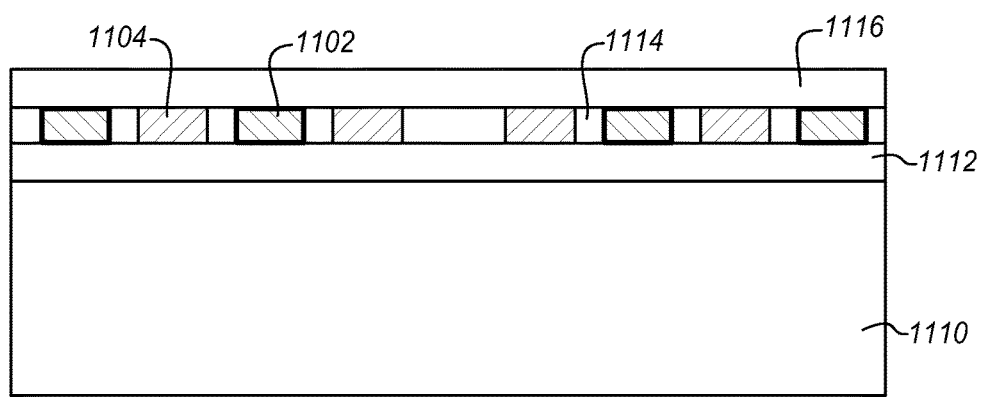

In the cross-sectional view of the same coil in FIG. 11B the mold substrate 1110 is covered by a dielectric layer formed over the substrate 1112. The two coils 1102, 1104 are formed over this dielectric with dielectric between the coils 1114 and passivation 1116 formed over the coils to isolate them from any external components. These two common coils allow for additional passive devices to be formed. They can be coupled together to double the inductance or they may be used as separate windings for a transformer, a coupler or for separate circuits. The dielectric between the coils and the substrate and between each of the coils in a single layer in this and in the other examples is optional. In general, when there is no component, such as an SMD, embedded in the mold compound or body portion of the IPD), then no dielectric layer is necessary. The particular selection and use of dielectrics and dielectric layers in each of the illustrated example may be selected to suit requirements of a particular IPD and substrate configuration.

Figure 12A:
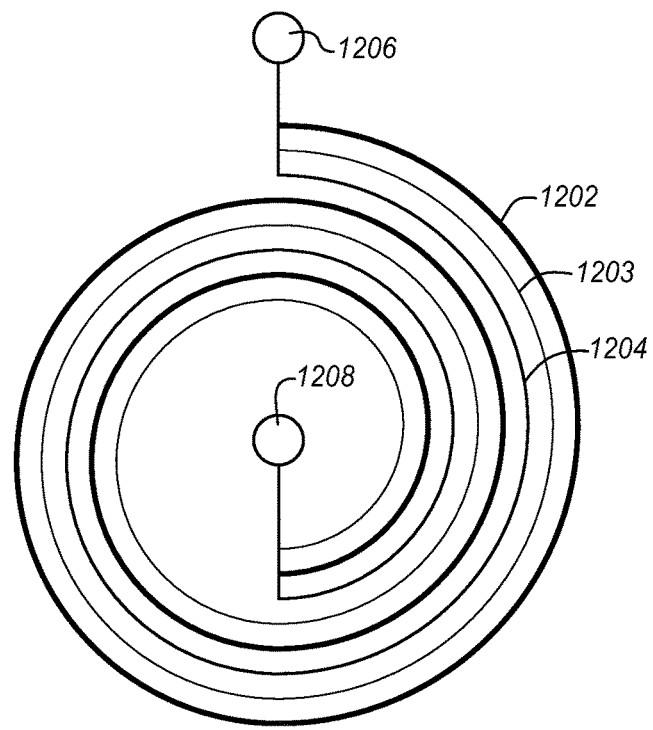
FIGS. 12A and 12B are top view diagrams of a tunable single coil formed in a polymer substrate before and after tuning, respectively, according to an embodiment.

FIG. 12A shows an alternative in which three coils are formed in concentric circles. FIG. 12A is a top plan view of a first 1202, second 1203 and third 1204 coil, which are all concentrically formed. The coils share a common pair of terminals 1206, 1208 which are coupled together. In other words, one end of each of the three coils is connected to the outer terminal 1206. The other end of each of the three coils is connected to the central terminal 1208. In addition, while the first coil 1202 and the third coil 1204 make two and one-half revolutions around the central point 1208, the second coil 1202 makes two and one-half complete revolutions around the central terminal 1208. The third coil makes only one and one-half revolutions around the central terminal. By making each of the coils, or at least one of the coils have a different length from the other two coils, there is greater flexibility in tuning the resulting inductor.

Figure 12B:
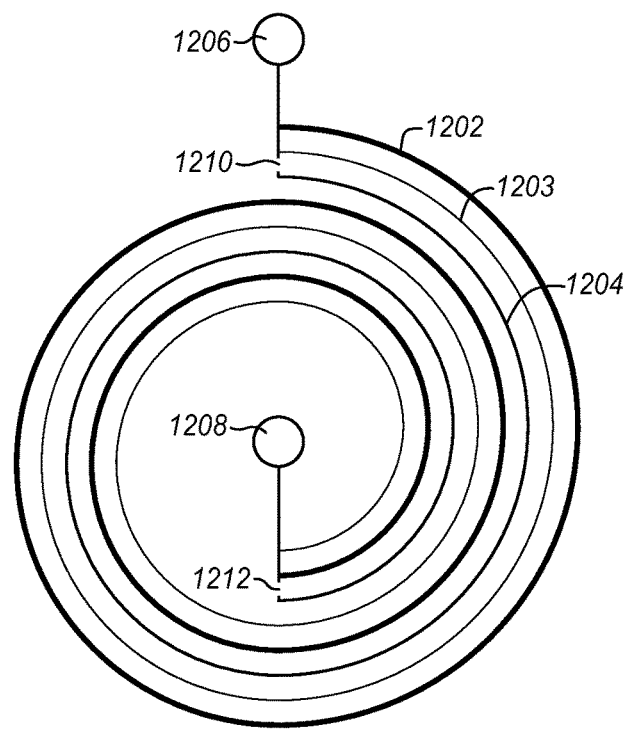

FIG. 12B shows how these three coils may be used to make an inductor that is tunable. FIG. 12B is a top plan view of the same three coils as in FIG. 12A. However, in FIG. 12B the connection of the third coil 1204 with the two other coils 1202, 1203 has been broken at a point 1210 where the third coil meets the outer terminal 1206 and also at a point 1212 where the third coil connects to the central terminal. The choice of which connection to break may be made depending upon how the coils are to be tuned. In other words, the inductance of the coil or some other parameter may be measured and then a cut may be made through one of the metal connector layers to adjust the length of the combined coils to obtain the intended value.

Figure 13A:
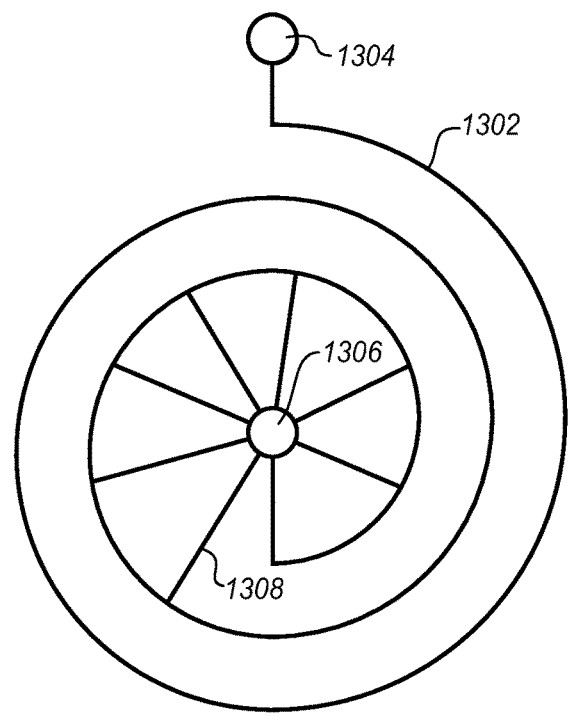
FIGS. 13A and 13B are top diagrams of an alternative tunable single coil formed in a polymer substrate before and after tuning, respectively, according to an embodiment.

FIG. 13A shows another example of a tunable coil. FIG. 13A is a top plan view of a coil 1302 with an outer terminal 1304 and an inner terminal 1306. The coil makes two and one-half revolutions about the central terminal. However, in the final revolution around the center, radial shorts 1308 are formed between the coil and the central terminal 1306. Each of these shorts allows the coil to be connected to the central terminal at a different position around the last loop of the coil. Each of the shorts is about 45° apart so that there are eight different shorting connectors around the last loop of the coil.

Figure 13B:
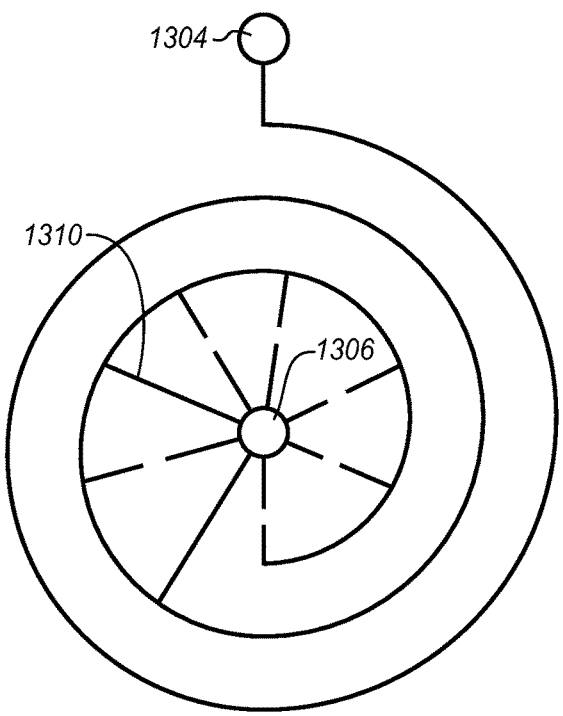

In FIG. 13B, seven of the shorting lines have been cut so that they no longer connect the last loop of the coil to the central terminal 1306. However, one of the shorts 1310 has been left intact. As a result, instead of the coil making a total two and one-half loops around the central terminal, the coil makes only about one and three-quarters loops around the central terminal. The coil is thus shortened to adjust its values. While in this and the other examples only a few loops are shown for the illustrated coils, this is done in order to simplify the drawings. Coils may be formed on the polymer carrier that have many more loops than those shown in the drawing figures.

This tunability is applicable to any of the coil versions described herein. The coil structure in FIG. 13A contains multiple connections from the die pad to the coil. This way, after electrical test, the length of the coil can be adapted to the needs of the system by opening the not needed connections by laser or similar equipment. This cannot be done if the IPD substrate is silicon (because the laser would destroy silicon or circuits below).

An alternative way to tune the coil is to add a connection instead of removing one. A new metal line can be generated to connect any position along the coil to the starting point. A short may be generated to set the effective length of the coil after a test of the die with a particular preset coil length. This can be done by printing, jetting, or dispensing a conductive material, which connects the coil with the starting point or connection. Wire binding or a solder bridge may alternatively be used. As a further alternative, a "bridge" can be attached by soldering or other contact mechanism. The bridge can be a Zero-Ohm resistor, a piece of substrate or silicon with a conductive connection capability or just a solder bridge.

The coils may also be tuned by splitting the coil into multiple single coils e.g. two, three, or more, and then connect as many as are desired for the purpose. This is shown in FIG. 12A. Alternatively, the coils are formed with connections already in place and the connection to one or more of the single rings is removed. The removal can be done e.g. by laser cutting. Both of these techniques may be applied to coils in multiple planes or layers.

Figure 14A:
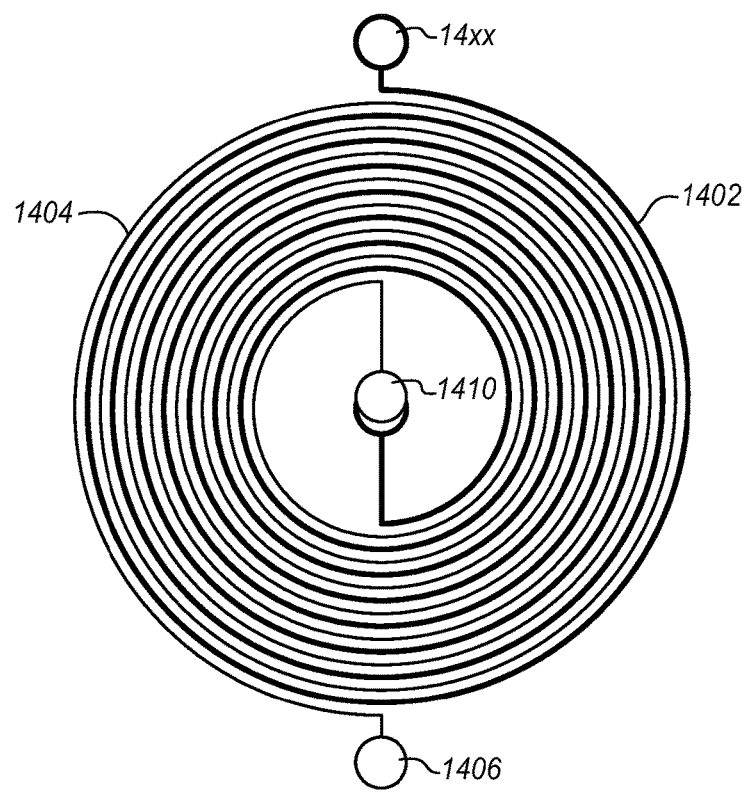
FIGS. 14A and 14B are top and side cross-sectional diagrams, respectively, of two coils formed in two different layers of a polymer substrate according to an embodiment.

FIG. 14A is a top plan view of another coil which is formed from two coils in different RDL layers formed on the polymer carrier 1410. A first coil 1402 is formed on a lower layer of the IPD mold and a second coil 1404 is formed on an upper layer of the IPD mold. The two coils share a common central terminal 1410, however, the upper coil 1402 has its own outer terminal and the lower coil 1404 also has its own outer terminal 1406. The two coils can be combined by connecting their terminals together. This allows a higher level of inductance to be created in a smaller amount of space. Alternatively, the coils can be connected to different components to serve different purposes.

Figure 14B:
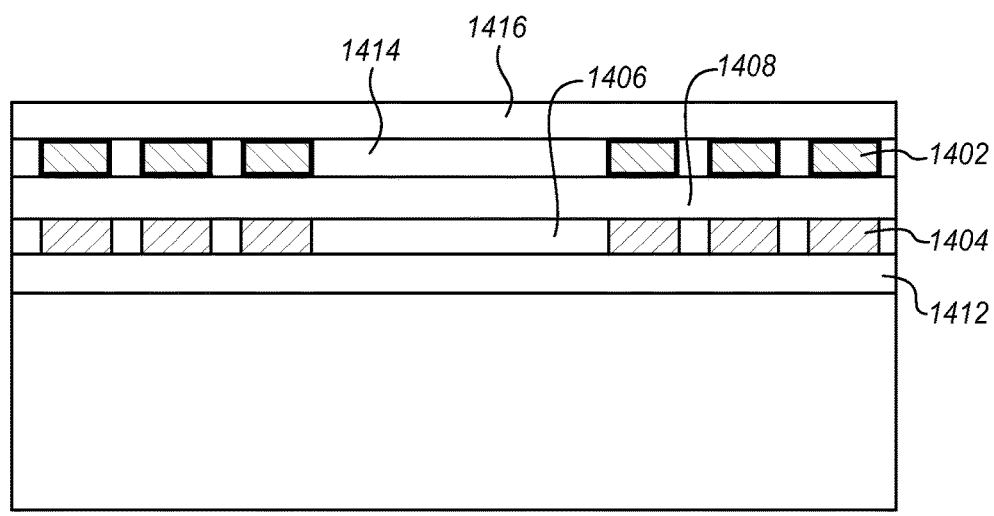

FIG. 14B is a cross-sectional side view of the two coils as formed on a polymer mold carrier. The carrier 1410 has a first dielectric layer 1412 upon which the lower coil 1404 is formed. This coil is embedded in a dielectric layer 1406 to isolate it from other conductive lines. A second dielectric 1408 is formed over the coil. The upper coil 1402 is then formed over the second layer of dielectric in the same manner as the first coil. The particular number of windings and other features of the coil may be varied depending upon the intended application. Another dielectric layer isolates the windings from each other 1414 and a top passivation layer 1416 isolates all of the coils from the connection array or other conductive components which may be formed on the top of the IPD mold.

Figure 15A:
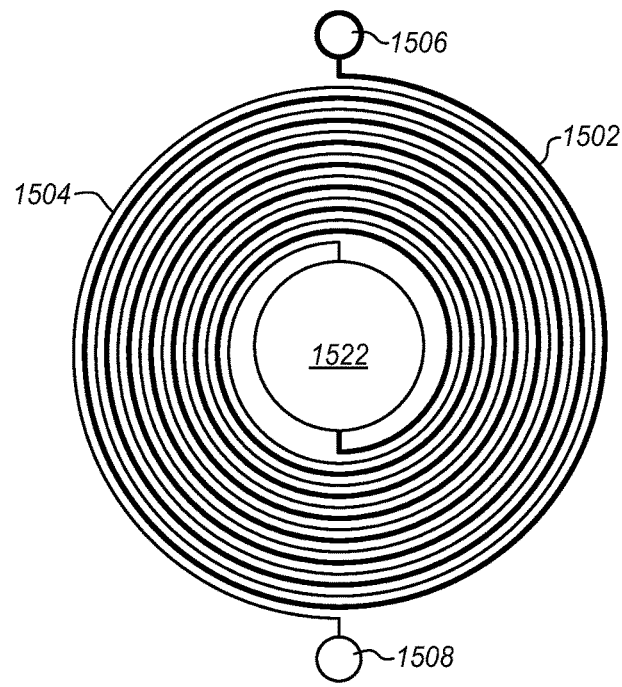
FIGS. 15A and 15B are top and side cross-sectional diagrams, respectively, of two coils formed in two different layers of a polymer substrate with a tunable core according to an embodiment.

FIG. 15A shows a further variation of a tunable coil that uses a solid core. FIG. 15A is a top plan view of two coils 1502 and 1504 which are formed in two different layers as in the example FIG. 14B. The first coil has an outer terminal 1506 and the second coil has an outer terminal 1508. The two coils are both wrapped around a central core 1522. In this example, the core serves as a connection terminal for the two coils but this is not necessary. The nature of the connections and the user of the cores may be adapted to suit different implementations. This core may be adjusted in size in order to change the physical parameters of the coil.

Figure 15B:
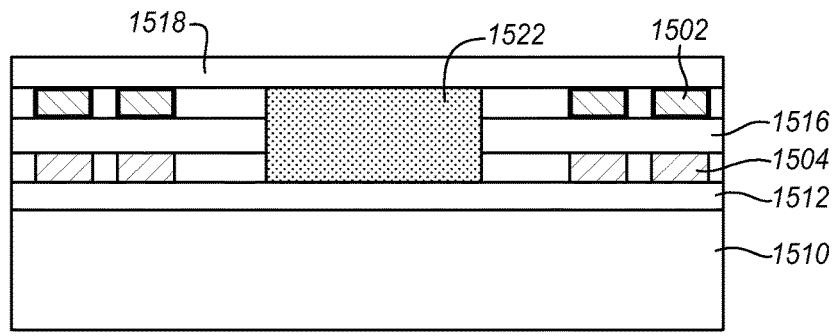

FIG. 15B is a cross-sectional side view of the two coils 1502, 1504 with the central core 1522. The polymer mold carrier 1510 supports a first dielectric layer 1512 upon which the first coil 1504 is formed. In addition, the central core 1522 is also formed over the first dielectric layer 1512. A second dielectric layer 1516 is formed over the lower layer 1504 and the upper coil 1502 is formed over the second dielectric layer. A passivation layer 1518 is formed over all of the coils and the central core.

Figure 15C:
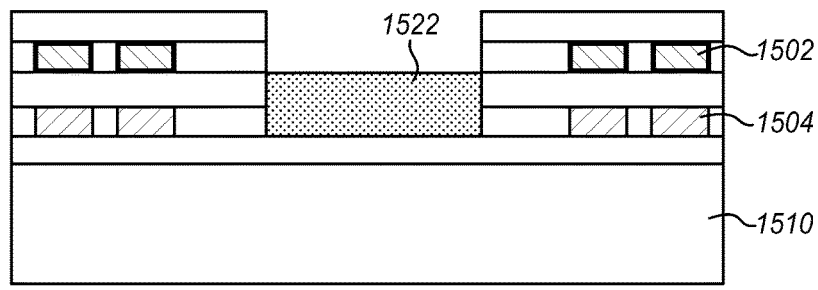
FIG. 15C is a side cross-sectional diagram of the coil of FIG. 15B after tuning according to an embodiment.

As described above with respect to FIG. 2H, in this and the other coil examples, a connection array may be formed over the passivation layer to allow connections to be made to these coils. In FIG. 15C the same components are present including the two coils 1502, 1504. The core 1522, however, has been modified to change the inductance of the coils. This may be done to change the two coils independently or the two coils may be connected as shown in FIG. 15A so that changing the core changes the total inductance of the combined system. In this example, the core has been drilled down with, for example, laser drilling or milling. To reduce the amount of material that makes up the core. Changing the core changes the inductance and other characteristics of the two coils.

In the tuning option is shown in FIG. 15C, a core e.g. a magnetic core can be embedded in the center of the coil into the mold compound or the dielectric layer. For tuning, parts of the core may be removed by laser, drilling, milling, or any other way. The core can be thinned or parts of it may be removed to form layers, partial layers, holes, or other thinned structures.

Tuning is also possible, in the case of coils that do not have a metal core by removing a portion of the dielectric material in the center of the coil. The removed dielectric is typically replaced by air which is another dielectric material with a dielectric constant of 1. Center dielectric can be removed by drilling holes into the dielectric with a laser or by drilling, milling or cutting.

All of the tuning techniques described herein can also be combined in order to achieve a wider range of values or a more accurate result. The tunability of the features is not restricted to polymer IPD components. A mixed carrier may also or alternatively be used. Molded fan-out wafers, flip-chip substrates, embedded die packages, and other packages, may be used where polymer substrates of any format and material are used. Combining a polymer IPD die with other types of polymer substrate packages may allow a single die to serve multiple functions.

The techniques described herein may be used to produce a wide variety of different devices including embedded R, L and C components with excellent performance and Q-factor.

IPD diplexers, filters for wireless applications, compact baluns for RF applications, library RLC components, and filters and baluns for GSM, DCS, PCS, GPS and WLANa/b/g. Possible applications for polymer IPDs include RF Power Amplifier Matching/Filters and Couplers, Front End Modules (FEM), GSM/DCS and CDMA cellular phones, Wireless LAN 802.11a/b/g and WiMax systems, 802.11a/b/g and WiMax filters, GPS Systems, Functional Interposers, Multi-band RF Transceivers, and miniaturization of RF Systems.

Figure 16:
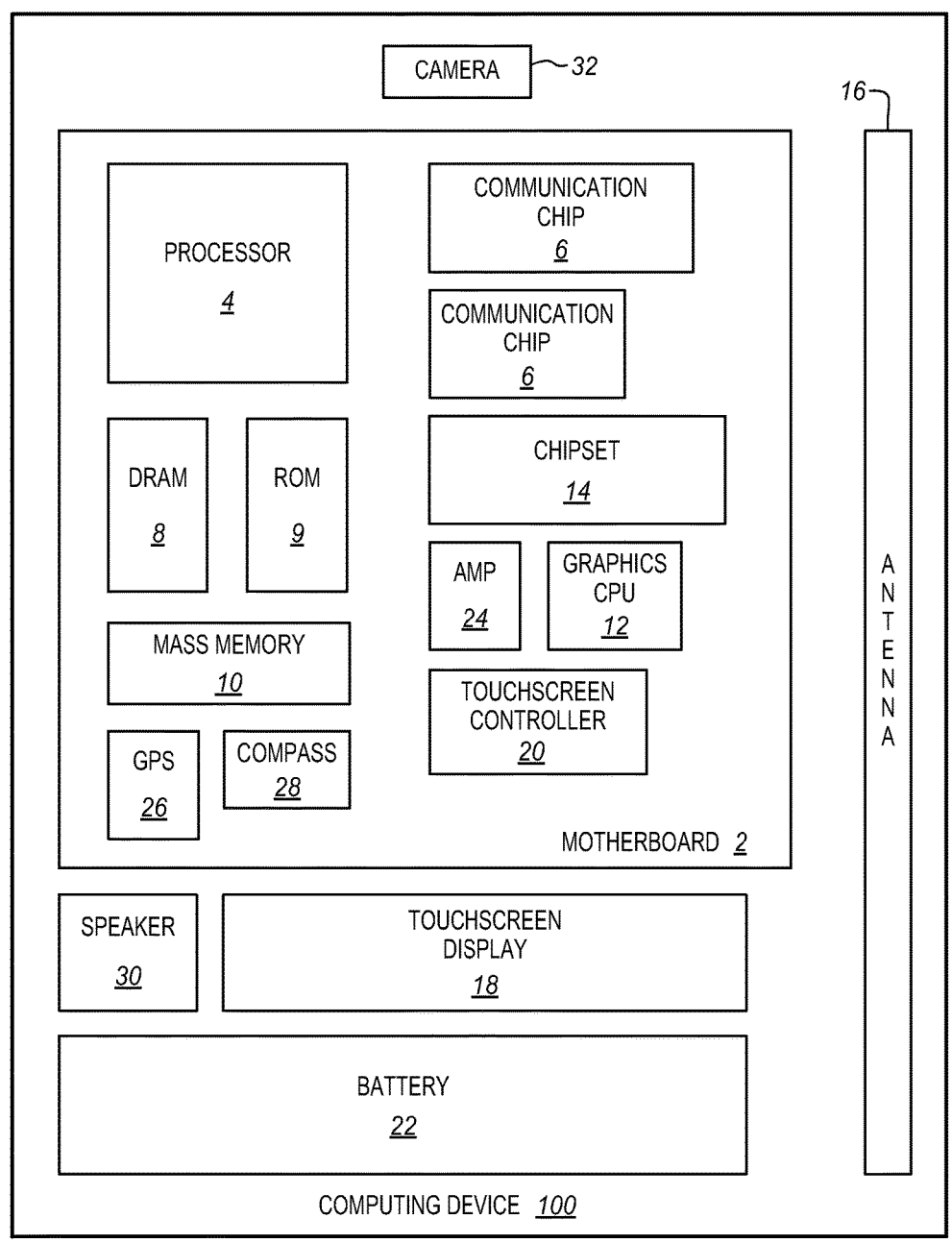
FIG. 16 is a block diagram of a computing device incorporating a tested semiconductor die according to an embodiment.

FIG. 16 illustrates a computing device 11 in accordance with one implementation of the invention. The computing device 11 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

The processor 4 of the computing device 11 includes an integrated circuit die packaged within the processor 4. In some implementations of the invention, the integrated circuit die of the processor, memory devices, communication devices, or other components include or are packaged with substrates with integrated passive devices as described herein, if desired. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a passive electrical device on a polymer substrate that includes a polymer substrate, a conductive layer over the polymer substrate, the conductive layer being in a pattern to form a passive electrical device and at least two terminals of the device, and a plurality of external connection pads connected to the terminals of the device.

In further embodiments, the polymer substrate is formed of mold material filled for example with one or more of aluminum oxide, or silica. In further embodiments, the polymer substrate is formed from a laminate, a prepreg, or an epoxy resin. In further embodiments, the polymer substrate is formed by compression molding a filled mold material onto a temporary carrier and releasing the temporary carrier. In further embodiments, the conductive layer is formed by depositing a metal and then patterned etching. In further embodiments, the conductive layer comprises a redistribution layer formed on the polymer substrate. In further embodiments, the pattern is a plurality of coils. In further embodiments, the plurality of coils is tunable by disconnecting one of the coils from the plurality of coils. In further embodiments, the plurality of coils is tunable by short circuiting a portion of one coils to a terminal of the passive electrical device.

Further embodiments include a dielectric layer over the conductive layer and a second conductive layer in a pattern to form a second passive electrical device and at least two terminals of the second device over the dielectric layer.

Further embodiments include a passive electrical component embedded in the polymer substrate and external connectors extending to the conductive layer to externally connect the embedded component.

In further embodiments, the external connection pads comprise a ball grid array or a flip-chip bump connection. In further embodiments, the passive electrical device comprises a tunable feature. In further embodiments, the tunable feature comprises an additional portion of a coil that may be disconnected by removing a portion of the metal layer. In further embodiments, the tunable feature comprises a portion of the passive electronic device that can be trimmed. In further embodiments, the tunable feature comprises a portion of the passive electrical device that is not electrically connected to the remainder of the device.

Some embodiments pertain to a method of forming a passive electrical device on a polymer substrate that includes forming a conductive layer over a polymer substrate in a pattern to form a passive electrical device, forming the conductive layer to form at least two terminals of the device, and forming a plurality of external connection pads over the conductive layer connected to the terminals of the device.

Further embodiments include forming a dielectric layer over the passive electrical device, wherein forming the external connection pads comprises forming the pads over the dielectric layer.

Further embodiments include pressing a mold compound filled for example with one or more of aluminum oxide, or silica over a temporary substrate and releasing the temporary substrate to form the polymer substrate.

Further embodiments include placing a passive electrical component on the temporary carrier before pressing the mold compound to embed the component in the polymer substrate.

In further embodiments, forming the conductive layer comprises depositing a metal and then performing patterned etching. In further embodiments, wherein the pattern is a plurality of coils.

Further embodiments include forming a dielectric layer over the conductive layer and forming a second conductive layer in a pattern to form a second passive electrical device and at least two terminals of the second device over the dielectric layer.

Further embodiments include attaching solder balls over the external connection pads to form a ball grid array. Further embodiments include tuning the passive electrical device.

In further embodiments, tuning comprises disconnecting a portion of the conductive layer from the passive electrical device. In further embodiments, tuning comprises trimming a portion of the passive electrical device.

Some embodiments pertain to a computing system that includes a communication chip for communication of data to and from the computing system, a processor, and integrated passive devices over a polymer substrate wherein there is a conductive layer over the polymer substrate, the conductive layer being in a pattern to form a passive electrical device and at least two terminals of the device, and a plurality of external connection pads connected to the terminals of the device.

In further embodiments, the conductive layer comprises a redistribution layer formed on the polymer substrate. In further embodiments, the pattern is a plurality of coils that are tunable by short circuiting a portion of one coils to a terminal of the passive electrical device.

Further embodiments include a passive electrical component embedded in the polymer substrate and external connectors extending to the conductive layer to externally connect the embedded component.

What is claimed is:

1. An Apparatus with a passive electrical device on a polymer substrate comprising:
    a polymer substrate formed over a plurality of electrical devices, wherein the electrical devices have one or more exposed pads;
    a dielectric layer formed over the polymer substrate and the exposed pads, wherein the dielectric layer is patterned to form one or more via openings over the exposed pads;
    a conductive layer over the polymer substrate, the dielectric layer, and the one or more via openings to form one or more vias, wherein the conductive layer is patterned to form a passive electrical device and at least two terminals of the device that are electrically coupled to the one or more vias to form one or more circuits with the electrical devices of the polymer substrate;
    a dielectric solder stop layer over the conductive layer;
    a plurality of external connection pads as solder balls over the solder stop layer for connection to a package substrate and over the conductive layer connected to the terminals of the device; and
    the package substrate attached to the external connection pads of the polymer substrate on one side and having a ball grid array on an opposite side to attach to a printed circuit board.

2. The apparatus of claim 1, wherein the polymer substrate is formed by compression molding a filled mold material onto a temporary carrier and releasing the temporary carrier.

3. The apparatus of claim 1, wherein the conductive layer comprises a redistribution layer formed on the polymer substrate.

4. The apparatus of claim 1, wherein the pattern ids a plurality of coils that is tunable by disconnecting one of the coils from the plurality of coils.

5. The apparatus of claim 1, wherein the pattern is a plurality of coils that is tunable by short circuiting a portion of one of the coils to a terminal of the passive electrical device.

6. The apparatus of claim 1, further comprising a dielectric layer over the conductive layer and a second conductive layer in a pattern to form a second passive electrical device and at least two terminals of the second device over the dielectric layer.

7. The apparatus of claim 1, further comprising a passive electrical component embedded in the polymer substrate and external connectors extending to the conductive layer to externally connect the embedded passive electrical component.

8. The apparatus of claim 1, wherein the passive electrical device comprises a tunable feature that is an additional portion of a coil that may be disconnected by removing a portion of the patterned conductive layer.

9. The apparatus of claim 1, wherein the passive electrical device comprises a tunable feature that is a portion of the passive electronic device that can be trimmed.

10. The apparatus of claim 1, further comprising an additional passive electrical device attached to the substrate on a side opposite the dielectric solder stop layer and coupled to a connection pad by a via through the substrate.

11. A method of forming a passive electrical device on a polymer substrate comprising:
    forming a polymer substrate over a plurality of electrical devices, wherein the electrical devices have one or more exposed pads;
    forming a dielectric layer over the polymer substrate and the exposed pads, wherein the dielectric layer is patterned to form one or more via openings over the exposed pads;
    forming a conductive layer over the polymer substrate, the dielectric layer, and the one or more via openings to form one or more vias, wherein the conductive layer is patterned to form a passive electrical device;
    forming the conductive layer to form at least two terminals of the device that are electrically coupled to the one or more vias to form one or more circuits with the electrical devices of the polymer substrate;
    forming a dielectric solder stop layer over the conductive layer;
    forming a plurality of external connection pads a solder balls over the solder stop layer for connection to a package substrate over the conductive layer connected to the terminals of the device; and
    attaching the external connection pads to the package substrate, the package substrate having a ball grid array opposite the polymer substrate to attach to a printed circuit board.

12. The method of claim 11, further comprising forming a dielectric layer over the passive electrical device and wherein forming the external connection pads comprises forming the pads over the dielectric layer.

13. The method of claim 11, further comprising pressing a mold compound filled with one or more of aluminum oxide, or silica over a temporary substrate and releasing the temporary substrate to form the polymer substrate.

14. The method of claim 13, further comprising placing a passive electrical component on the temporary carrier before pressing the mold compound to embed the component in the polymer substrate.

15. The method of claim 11, wherein forming the conductive layer comprises depositing a metal and then performing patterned etching.

16. The method of claim 11, further comprising forming a dielectric layer over the conductive layer and forming a second conductive layer in a pattern to form a second passive electrical device and at least two terminals of the second device over the dielectric layer.

17. The method of claim 11, further comprising tuning the passive electrical device.

18. A computing system comprising:
    a communication chip for communication of data to and from the computing system;
    a processor;
    a printed circuit board to connect the communication chip and the processor; and
    integrated passive devices over a polymer substrate, wherein the integrated passive devices have one or more exposed pads, wherein a dielectric layer is formed over the polymer substrate and the exposed pads, wherein the dielectric layer is patterned to form one or more via openings over the exposed pads, wherein there is a conductive layer over the polymer substrate, the dielectric layer, and the one or more via openings to form one or more vias, wherein the conductive layer is patterned to form a passive electrical device and at least two terminals of the device that are electrically coupled to the one or more vias to form one or more circuits with the electrical devices of the polymer substrate, a dielectric solder stop layer over the conductive layer, a plurality of external connection pads as solder balls over the solder stop layer for connection to a package substrate and over the conductive layer connected to the terminals of the device, and the package substrate attached to the external connection pads of the polymer substrate on one side and having a ball grid array on an opposite side to attach to the printed circuit board.

19. The computing device of claim 18, wherein the conductive layer comprises a redistribution layer formed on the polymer substrate.

20. The apparatus claim 18, wherein the pattern is a plurality of coils that are tunable by short circuiting a portion of one coils to a terminal of the passive electrical device.

* * * * *